United States Patent
Rangarajan et al.

(10) Patent No.: US 6,458,607 B1
(45) Date of Patent: *Oct. 1, 2002

(54) USING UV/VIS SPECTROPHOTOMETRY TO REGULATE DEVELOPER SOLUTION DURING A DEVELOPMENT PROCESS

(75) Inventors: Bharath Rangarajan, Santa Clara, CA (US); Bhanwar Singh, Morgan Hill, CA (US); Ramkumar Subramanian, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/911,151

(22) Filed: Jul. 23, 2001

(51) Int. Cl.[7] .............................................. H01L 21/66
(52) U.S. Cl. .............................. 438/14; 438/15; 438/16; 438/430
(58) Field of Search .............................. 438/14, 15, 16, 438/430; 396/371

(56) References Cited

U.S. PATENT DOCUMENTS

6,196,734 B1  3/2001  Templeton et al. ......... 396/571

Primary Examiner—John F. Niebling
Assistant Examiner—Olivia Luk
(74) Attorney, Agent, or Firm—Amin & Turocy, LLP (57) ABSTRACT

A system for regulating temperature of a developer is provided. The system includes a system for regulating in-situ developer temperature, comprising at least one lamp operative to heat a portion of a developer; a lamp driving system for driving the at least one lamp; a system for directing radiation to the portion of the developer; a measuring system comprising a UV/Vis spectrophotometry system for measuring parameters of the developer based on radiation reflected from the developer; and a processor operatively coupled to the measuring system and a lamp driving system, the processor receiving developer parameter data from the measuring system and the processor using the data to at least partially base control of the at least one lamp so as to regulate temperature of at least a portion of the developer

17 Claims, 6 Drawing Sheets

USING UV/VIS SPECTROPHOTOMETRY TO REGULATE DEVELOPER SOLUTION DURING A DEVELOPMENT PROCESS

TECHNICAL FIELD

The present invention generally relates to processing a semiconductor substrate. In particular, the present invention relates to a system and a method for regulating developer time and temperature.

BACKGROUND ART

In the semiconductor industry, there is a continuing trend toward higher device densities. To achieve these high densities there has been and continues to be efforts toward scaling down device dimensions (e.g., at submicron levels) on semiconductor wafers. In order to accomplish such high device packing density, smaller and smaller features sizes are required. This may include the width and spacing of interconnecting lines, spacing and diameter of contact holes, and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, or an electron beam) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Due to the extremely fine patterns which are exposed on the photoresist, application and maintaining a desired temperature of and time exposure to the developer are significant factors in achieving desired critical dimensions. The developer should be maintained at a uniform temperature in order to insure uniformity and quality of the underlying photoresist layer to be developed. Small changes in the time/temperature history of the developer can substantially alter image sizes, resulting in lack of image line control—a few degrees in temperature difference may drastically affect critical dimensions. For example, often substantial line size deviations occur when the developer temperature is not maintained within 0.5 degree tolerance across a silicon wafer. Likewise, uniform time exposure to the developer solution cannot compensate for variations at center to edge portions of a wafer. For example, printed gratings of a desired size often correspond to a mixture of sizes due to the center to edge variations across the wafer. That is, printed gratings may not be properly formed in a thicker portion of the wafer as opposed to a thinner portion of the wafer.

Thus, there is an unmet need for an efficient system/method to maintain developer time and temperature in order to increase fidelity in image transfer. There is also an unmet need for a system/method to compensate for center to edge variations in a wafer.

SUMMARY OF THE INVENTION

The present invention provides for a system and method which facilitates controlling developer temperature and time. More specifically, the system and method employ a non-destructive measuring system to monitor parameters of the developer which vary with respect to the temperature of the developer. This is accomplished in part by employing a plurality of optical fibers arranged to project radiation on respective portions of the developer. The radiation reflected from the developer is indicative of at least one of several parameters of the developer (e.g., thickness, color and absorption) which vary in correlation with developer time and temperature. For example, a plurality of heaters are arranged to each correspond to a particular developer portion, respectively—each heater is responsible for heating the particular developer portion. The developer temperature is monitored by the system, and the heaters are selectively driven by the system so as to maintain developer temperature at a desired level. As a result, substantial uniformity in developer temperature is achieved, which in turn increases fidelity of image transfer. Similarly, developer time is optimized in order to compensate for variations in the center to edge regions of the wafer.

One aspect of the present invention relates to a system for regulating in-situ developer temperature. The system includes at least one lamp operative to heat a portion of a developer; a lamp driving system for driving the at least one lamp; a system for directing radiation to the portion of the developer; a measuring system comprising a UV/Vis spectrophotometry system for measuring parameters of the developer based on radiation reflected from the developer; and a processor operatively coupled to the measuring system and a lamp driving system, the processor receiving developer parameter data from the measuring system and the processor using the data to at least partially base control of the at least one lamp so as to regulate temperature of at least a portion of the developer.

Another aspect of the present invention relates to a method for regulating in-situ developer temperature and exposure time. The method involves the steps of defining a substrate as a plurality of portions; defining a developer deposited over the substrate as a plurality of portions; directing radiation having a wavelength from 190 nm to about 800 nm onto at least one of the portions of the substrate and of the developer; collecting radiation intensity reflected from the at least one portion corresponding to the substrate and to the developer; during development, analyzing the reflected radiation intensity to determine the temperature of the at least one portion of the developer and to determine image size of the at least one portion of the substrate; controlling a heating device to regulate the temperature of the developer portion; and controlling a timing mechanism to regulate the exposure time of the substrate portion.

Yet another aspect of the present invention relates to a method for regulating in-situ temperature and exposure time of a developer, the developer overlying a substrate comprising an image pattern. The method involves the steps of partitioning the developer into a plurality of grid blocks; using a plurality of heaters to heat the developer, each heater functionally corresponding to a respective grid block; using a plurality of timers to time the exposure time of the developer, each time sensor corresponding to a respective grid block; determining temperatures corresponding to the respective grid blocks of the developer using a UV/Vis spectrophotometry system; determining exposure times corresponding to the respective grid blocks of the developer using a UV/Vis spectrophotometry system; and using a processor to coordinate control of the heaters and timers, respectively, in accordance with determined temperatures and exposure times of the respective grid blocks of the developer.

Still yet another aspect of the present invention relates to a system for regulating in-situ temperature of a developer means for defining a substrate as a plurality of portions. The system includes means for defining a developer deposited over the substrate as a plurality of portions; means for directing radiation having a wavelength from 190 nm to about 800 nm onto at least one of the portions of the substrate and of the developer; means for collecting radiation intensity reflected from the at least one portion corresponding to the substrate and to the developer; during development, means for analyzing the reflected radiation intensity to determine the temperature of the at least one portion of the developer and to determine image size of the at least one portion of the substrate; means for controlling a heating device to regulate the temperature of the developer portion; and means for controlling a timing mechanism to regulate the exposure time of the substrate portion.

DISCLOSURE OF INVENTION

The present invention involves a system and method for regulating the temperature and exposure time of a developer with respect to an underlying substrate. In particular, the system and method utilize a UV/Vis spectrophotometer to monitor the development process and control the parameters of the developer solution. The developer parameters may include thickness, color and absorptivity, all of which are affected and influenced by the temperature of the developer. Therefore, information obtained from the parameters of the developer facilitates controlling the temperature. For example, a color change in the developer may indicate deviation from the desired temperature.

In addition to temperature control, the present invention optimizes exposure time of the substrate with respect to the developer so that a uniform pattern image is formed despite center to edge variations on the substrate. Exposure time may be determined by measuring a profile of the substrate during and/or after development. In one aspect of the invention, the measured profile can then be compared to a number of stored profiles of known substrates having the same pattern image and known exposure times. In another aspect of the invention, the measured profile may be used to determine the exposure time using UV/Vis spectrophotometer techniques. The determined exposure time and corresponding image size can then be fed back into the development process system. This feedback facilitates optimization of the development process for the current and/or subsequent development process.

The present invention will now be described with reference to FIGS. 1–8, wherein like reference numerals are used to refer to like elements throughout. In the following description, for purposes of explanation, numerous specific details are set forth in order to provide a thorough understanding of the present invention. It may be evident, however, to one skilled in the art that the present invention may be practiced without these specific details. In other instances, well-known structures and devices are shown in block diagram form in order to facilitate description of the present invention. It should be understood that according to the present invention, the term "substrate" includes a semiconductor substrate as well as an image being patterned thereon via a development process.

Figure 1:
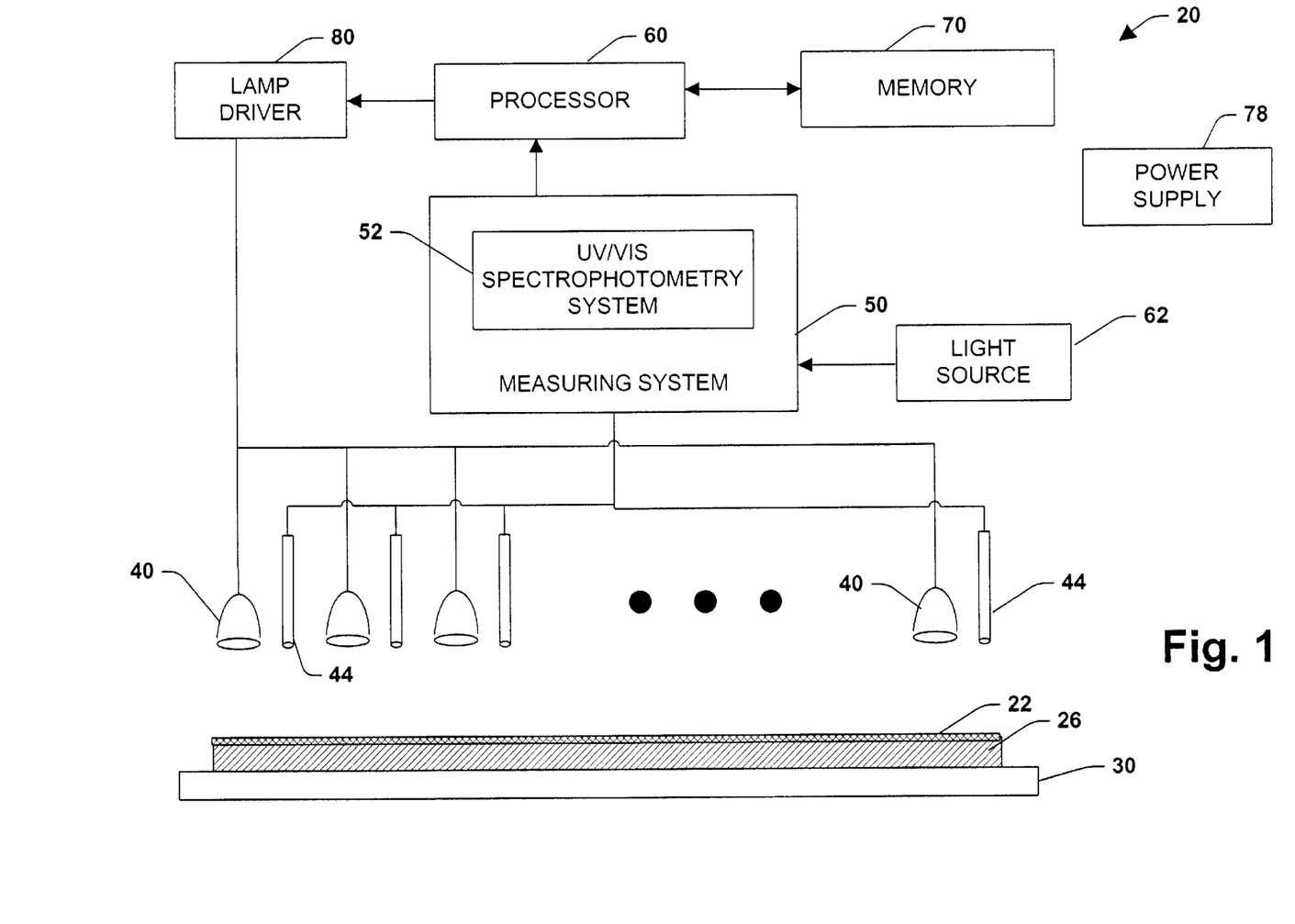
FIG. 1 illustrates a schematic block diagram of a developer heating system in accordance with the present invention.

Referring initially to FIG. 1, a system 20 for heating substantially uniformly a developer 22 is shown. The developer 22 is provided over a substrate 26 (including a photoresist formed thereon), which is, in turn, supported over a chuck 30. Although the present invention is primarily described within the context of heating developer, it is to be understood that the present invention may be applied to heating of top and bottom anti-reflective coatings, low K dielectric materials, photo resist spin-on-glass (SOG) and other spin-on materials.

The system 20 further includes a plurality of heat lamps 40 which are selectively controlled by the system 20 so as to facilitate uniform heating of the developer 22. A plurality of optical fibers 44 project radiation onto respective portions of the developer 22. Radiation reflected from the developer 22 is processed by a developer parameter measuring system 50 to measure at least one parameter relating to the temperature of the developer 22. The reflected radiation is processed with respect to the incident radiation in measuring the various parameters.

The measuring system 50 includes an Ultra-violent/ Visible (UV/Vis) spectrophotometer 52. It is to be appreciated that any suitable UV/Vis spectrophotometry system may be employed to carry out the present invention and such systems are intended to fall within the scope of the hereto appended claims. UV/Vis spectrophotometry systems are well known in the art, and therefore further discussion related thereto is omitted for sake of brevity.

A light source 62 of radiation at a specific wavelength or wavelengths provides radiation to the plurality of optical fibers 44 via the measuring system 50. The UV/Vis spectrophotometer typically utilizes two light sources: a deuterium arc lamp for consistent intensity in the UV range (i.e., 190–380 nm) and a tungsten-halogen lamp for consistent intensity in the visible (vis) spectrum (i.e., 380-about 800 nm). Some spectrophotometers may use a xenon flash lamp which offers decent intensity over the UV and visible regions. In conventional UV/Vis spectrophotometers, polychromatic light from a monochromator (not shown) is transmitted through a sample (e.g., developer 22), and the sample absorbance is determined by comparing intensity of the light hitting a detector (not shown but located within the measuring system 50) with intensity of light hitting the detector with the sample in place.

A processor 60 receives the measured data from the measuring system 50 and determines the temperature of respective portions of the developer 22. The processor 60 is operatively coupled to system 50 and is programmed to control and operate the various components within the developer heating system 20 in order to carry out the various functions described herein. The processor or CPU 60 may be any of a plurality of processors, such as the AMD K6®, AMD Athlon™, and other similar and compatible processors. The manner in which the processor 60 can be programmed to carry out the functions relating to the present invention will be readily apparent to those having ordinary skill in the art based on the description provided herein.

A memory 70 which is operatively coupled to the processor 60 is also included in the system 20 and serves to store program code executed by the processor 60 for carrying out operating functions of the system 20 as described herein. The memory 70 also serves as a storage medium for temporarily storing information such as developer temperature, temperature tables, developer coordinate tables, UV/vis spectrophotometer information, spectra relating to known and generated profiles of printed gratings, and other data which may be employed in carrying out the present invention. In addition, power supply 78 provides operating power to the system 20.

Any suitable power supply (e.g., battery, line power) may be employed to carry out the present invention.

The processor 60 is also coupled to a lamp driving system 80 which drives the heat lamps 40. The lamp driving system 80 is controlled by the processor 60 so as to selectively vary heat output of the respective heat lamps 40. Each respective portion of the developer 22 has a corresponding lamp 40 and optical fiber 44 associated therewith. The processor 60 is able to monitor the temperature of the various developer portions and selectively regulate the temperatures of each portion via the corresponding heat lamps 40. As a result, the system 20 provides for regulating heating temperature of the developer 22 with substantial uniformity, which in turn improves fidelity of image transfer in a lithographic process employing the developer 22.

According to another aspect of the present invention, the system 20 may also regulate in-situ image or printed grating sizes by generating a profile of a center to edge portion of the substrate 26 or at various spaced apart portions of the substrate 26. Generating the substrate profile may be carried out according to the present invention described herein above. The generated profile (i.e., measured data) may be communicated from the measuring system 50 to the processor 60 for analysis. Analysis involves comparing the generated profile with a database of known profiles for the purpose of determining whether the printed gratings on the substrate 26 are of the desired size. Adjustments to the developing time may then be communicated or fed back (in a closed loop) to the developing parameters in order to implement them, thereby compensating for substrate variations and obtaining the desired image size.

Figure 2:
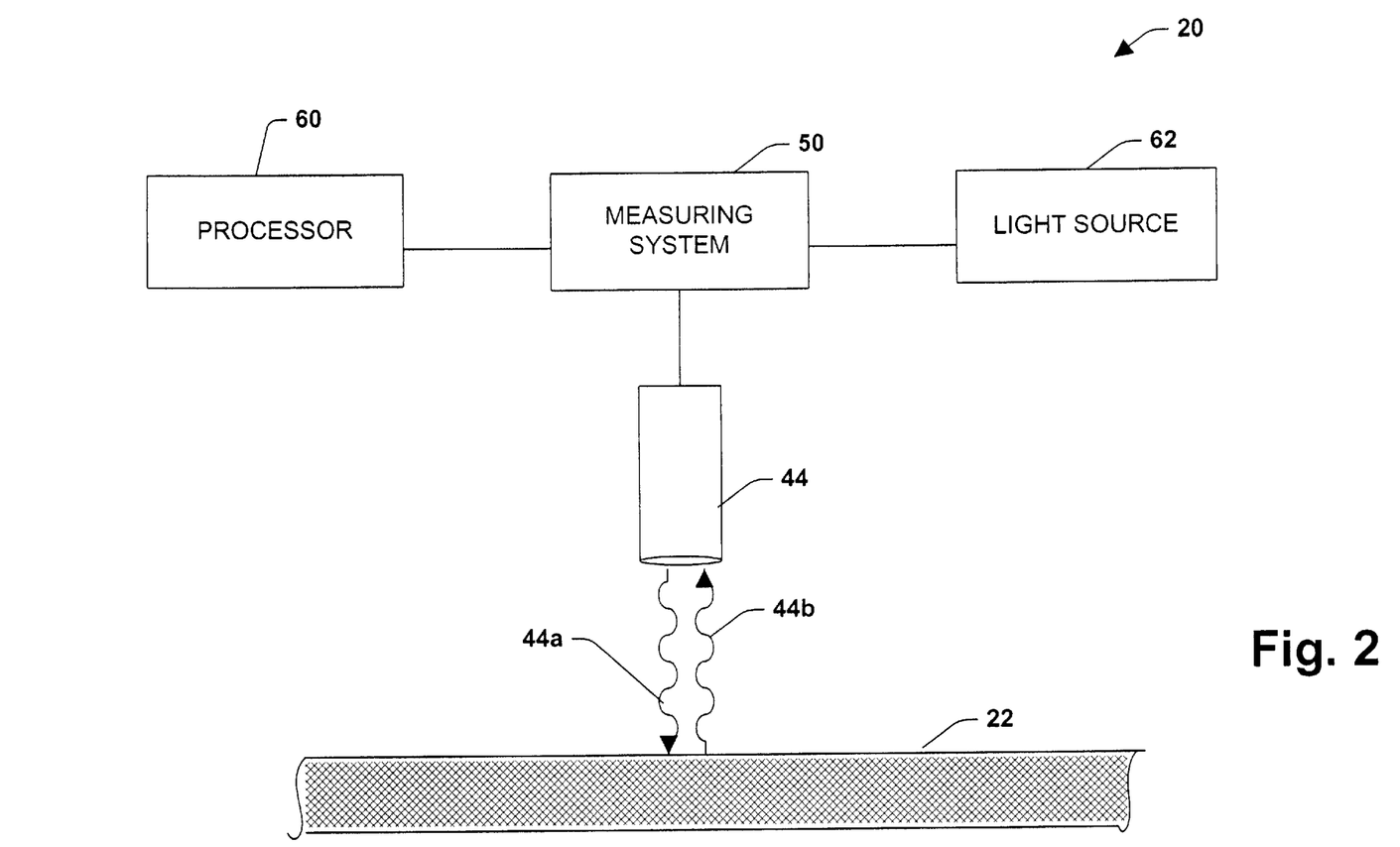
FIG. 2 illustrates a partial schematic block diagram of the system of FIG. 1 being employed in connection with determining developer temperature by measuring developer thickness in accordance with the present invention.

FIG. 2 illustrates the system 20 being employed to measure thickness of the developer 22 at a particular portion. The temperature of the developer 22 will have an impact on the thickness thereof. The optical fiber 44 directs radiation 44a incident to the surface of the developer 22, and the intensity of reflected radiation 44b from the surface of developer will vary in accordance with the thickness of the developer 22. The measuring system 50 collects the reflected radiation 44b and processes the reflected radiation 44b in accordance with UV/Vis spectrophotometry techniques to provide the processor 60 with data corresponding to the thickness of the developer 22. The processor 60 analyzes the data and determines the temperature of the developer 22.

Figure 3:
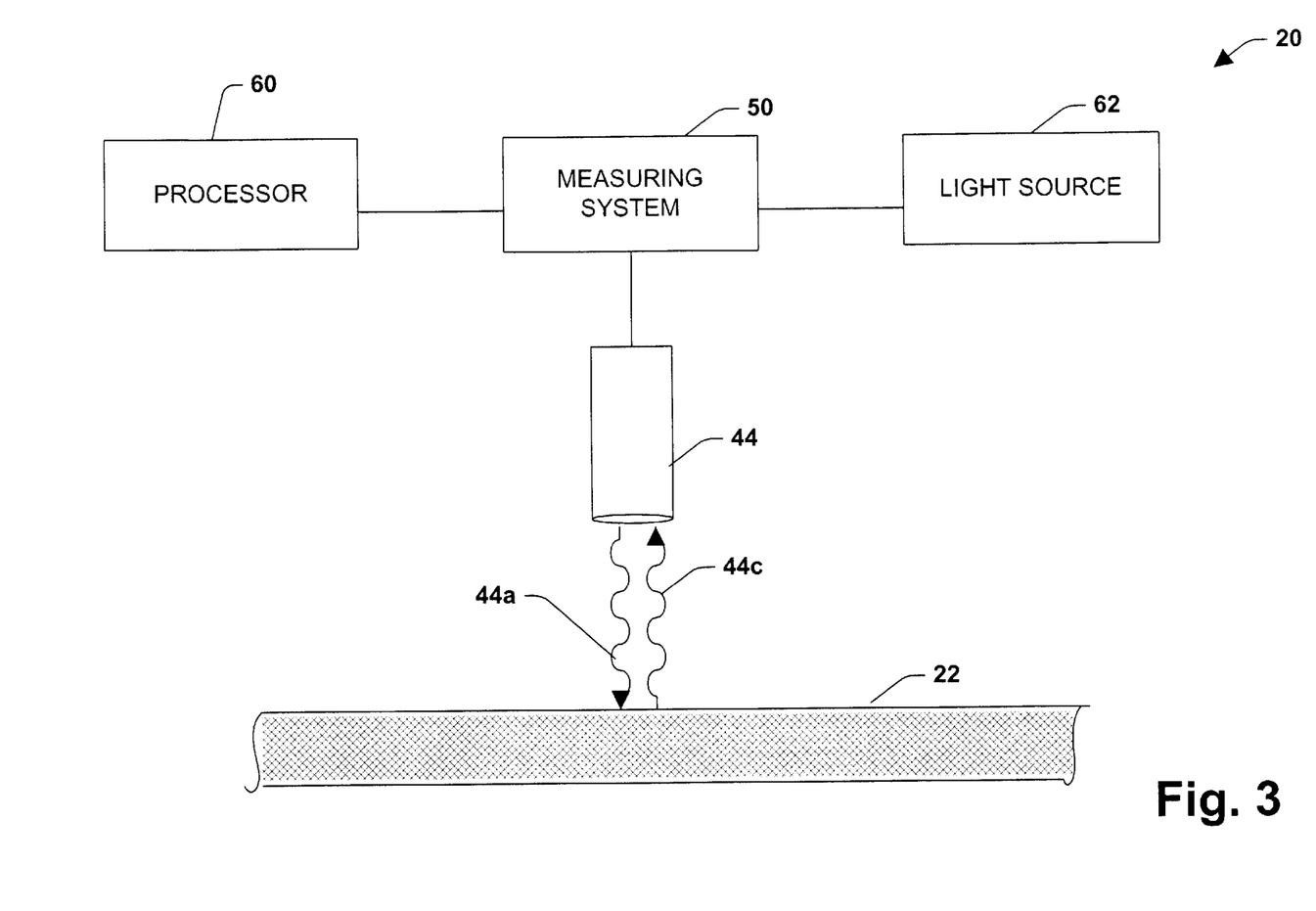
FIG. 3 illustrates a partial schematic block diagram of the system of FIG. 1 being employed in connection with determining developer temperature by measuring developer color in accordance with the present invention.

FIG. 3 illustrates the system 20 being used to measure fluorescence of the developer 22. A substantially inert fluorescence material (e.g., europium chelate) is combined with the developer 22 such that the color of the developer 22 will vary in accordance with the temperature thereof The inert fluorescence material is selected so as to not impede the performance of the developer 22. It is to be appreciated that any suitable material which provides for temperature related color change of the developer 22 without affecting the performance of the developer 22 may be employed and is intended to fall within the scope of the hereto appended claims. The optical fiber 44 directs the radiation 44a incident to the surface of the developer and the phase of reflected radiation 44c will vary in accordance with the color of the developer 22. The measuring system 50 collects the reflected radiation 44b and processes the reflected radiation 44b in accordance with spectrometry techniques to provide the processor 60 with data corresponding to the color of the developer 22. The processor 60 analyzes the data and determines the temperature of the developer 22.

Figure 4:
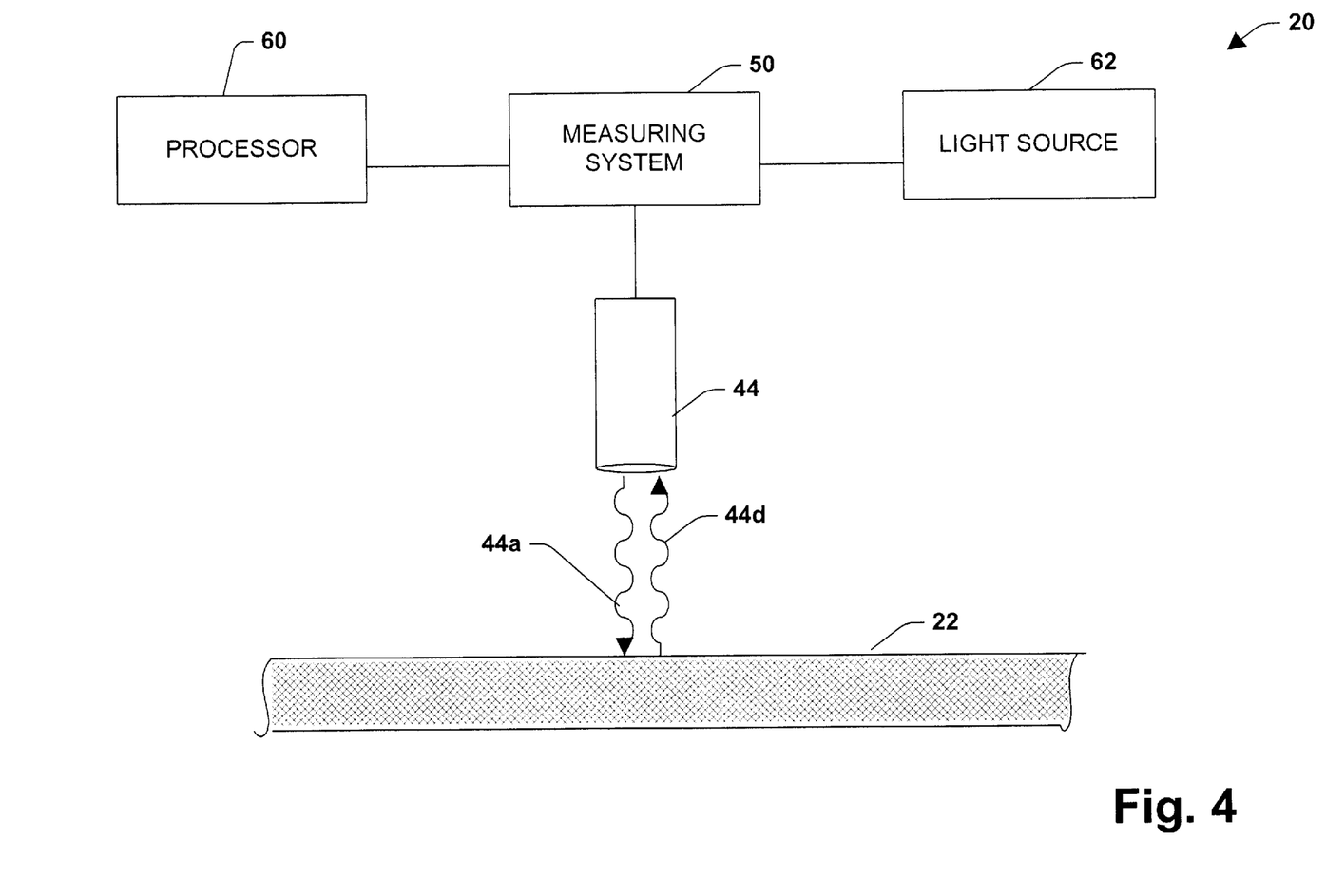
FIG. 4 illustrates a partial schematic block diagram of the system of FIG. 1 being employed in connection with determining developer temperature by measuring developer absorptivity in accordance with the present invention.

Yet another parameter that may be measured by the system 20 is absorptivity of the developer 22 as shown in FIG. 4. The absorption of the incident radiation 44a by the developer 22 corresponds to the temperature of the developer 22. Accordingly, the intensity of reflected radiation 44d will be indicative of the absorptivity of the developer 22 which in turn is indicative of developer temperature. The measuring system 50 collects the reflected radiation 44d and processes the reflected radiation 44d in accordance with interferometry and/or spectrometry techniques to provide the processor 60 with data corresponding to the absorptivity of the developer 22. The processor 60 analyzes the data and determines the temperature of the developer 22.

Figure 5:
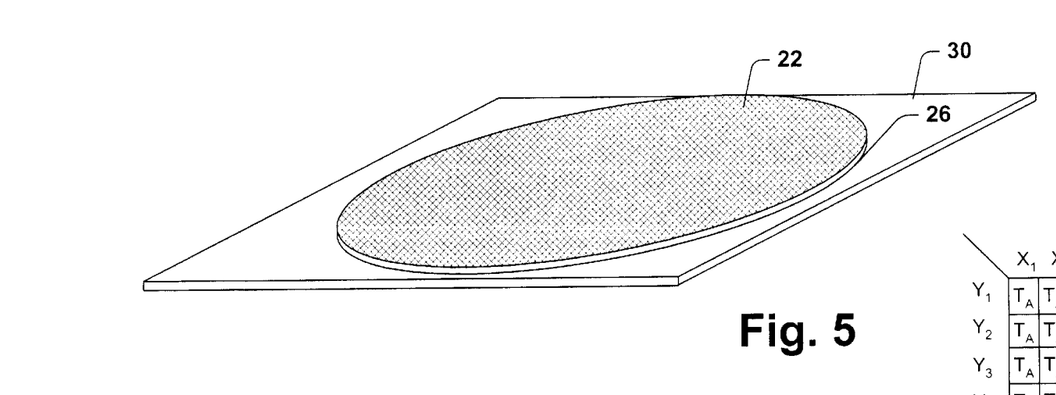
FIG. 5 illustrates a perspective illustration of a substrate (including photoresist) having a developer formed thereon in accordance with the present invention.
Figure 6:
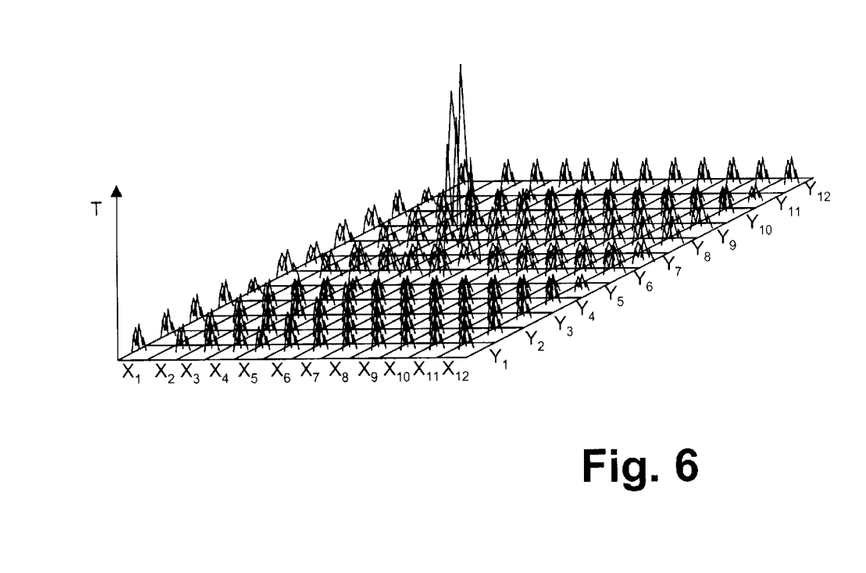
FIG. 6 illustrates a representative three-dimensional grid map of a developer illustrating temperature amplitudes taken at grid blocks of the grid map in accordance with the present invention.
Figure 7:
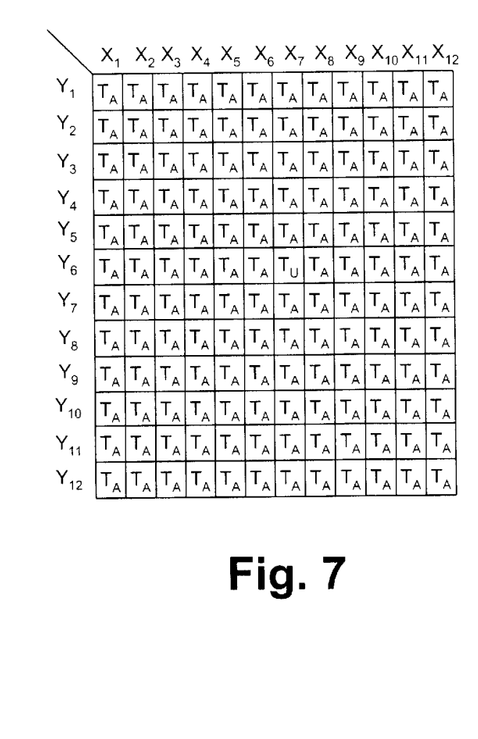
FIG. 7 illustrates a temperature amplitude table correlating the temperature amplitudes of FIG. 6 with desired values for the temperature amplitudes in accordance with the present invention.

Turning now to FIGS. 5–7, another aspect of the present invention is shown. In FIG. 5, the chuck 30 is shown in perspective supporting the substrate 26 having developer 22 thereon. The developer heating system 20 provides for regulating the temperature and exposure time of the developer 22 during the above described heating process in order to facilitate uniform heating and optimal exposure time of the developer 22. The developer 22 may be divided into a grid pattern as that shown in FIG. 6. Each grid block (XY) of the grid pattern corresponds to a particular portion of the developer 22, and each portion is individually monitored for temperature and exposure time as well as controlled for temperature and exposure time.

In FIG. 6 each respective portion of the developer ($X_1Y_1$ . . . $X_{12}$, $Y_{12}$) is being monitored for temperature and exposure time using a respective optical fiber 44, the measuring system 50 and the processor 60. The temperature amplitudes of each developer portion is shown. As can be seen, the temperature of the developer at coordinate $X_7Y_6$ is substantially higher than the temperature of the other developer portions XY. It is to be appreciated that although FIG.

6 illustrates the developer 22 being mapped (partitioned) into 144 grid block portions, the developer 22 may be mapped with any suitable number of portions. Although the present invention is described with respect to one optical fiber 44 corresponding to one lamp 40 which correspond to one grid block XY, it is to be appreciated that any suitable number of optical fibers 44 may correspond to any suitable number of lamps 40 and vice versa, and the like for grid blocks XY.

FIG. 7 is a representative table of temperature amplitudes (taken at the various grid blocks which have been correlated with acceptable temperature amplitude values for the portions of the developer 22 mapped by the respective grid blocks. It is to be understood that a similar table can be constructed for exposure times. As can be seen, all of the grid blocks except grid block $X_7Y_6$ have temperature amplitudes corresponding to an acceptable temperature value ($T_A$) (e.g., are within an expected range of temperature amplitudes), while grid block $X_7Y_6$ has an undesired temperature value ($T_U$). Thus, the processor 60 has determined that an undesirable temperature condition exists at the portion of the developer 22 mapped by grid block $X_7Y_6$. Accordingly, the processor 60 can drive the lamp 40 which corresponds to the portion of the developer 22 mapped at grid block $X_7Y_6$ so as to bring the temperature of this portion of the developer 22 down to an acceptable level. It is to be appreciated that the lamps 40 may be driven so as to increase and/or decrease the temperature of the respective developer portions as desired. It is to be understood that the present invention as described in FIGS. 5–7 may also be applied to optimizing develop time to compensate for center to edge variations in the substrate 26.

Figure 8:
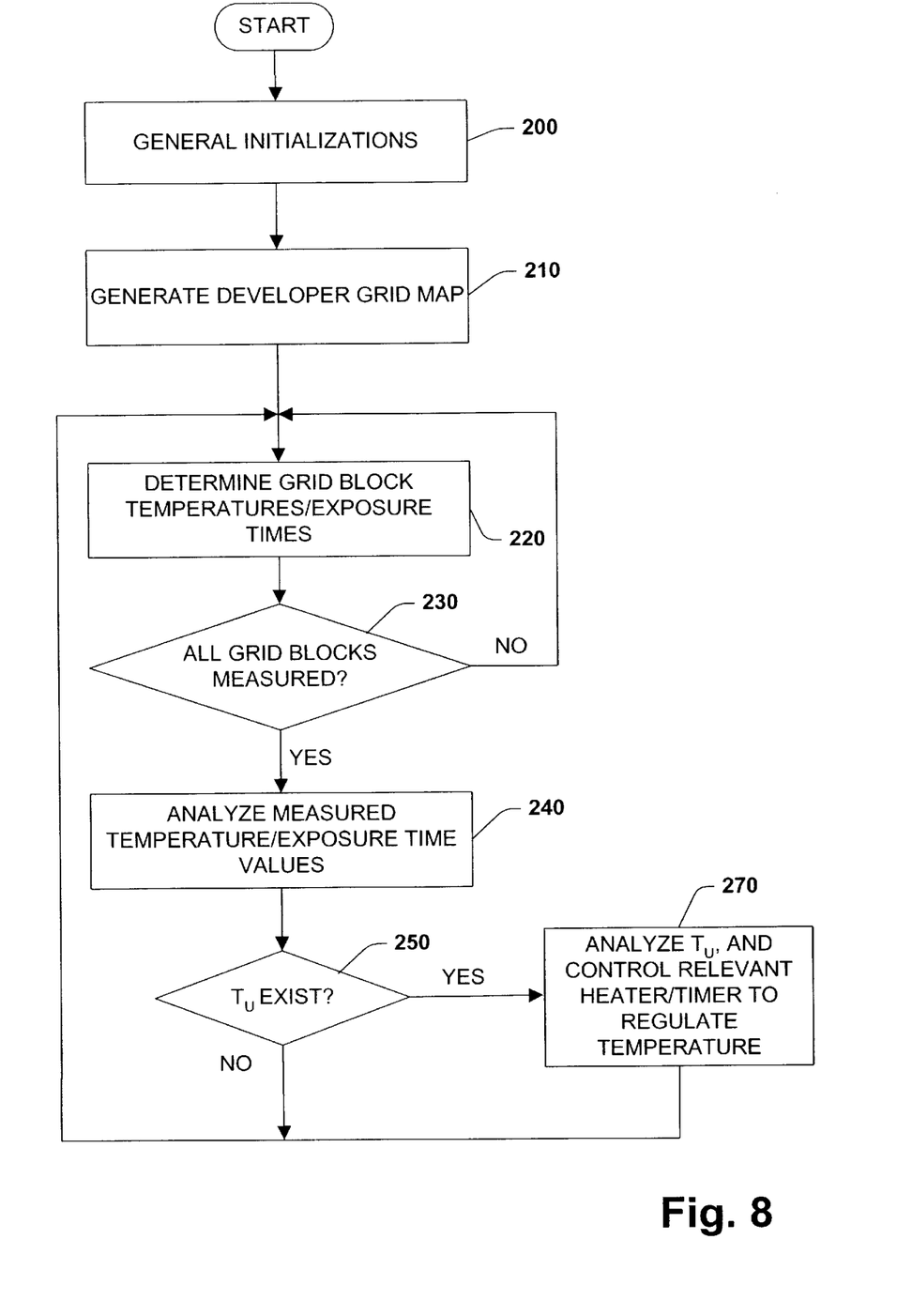
FIG. 8 illustrates a flow diagram illustrating one specific methodology for carrying out the present invention.

FIG. 8 is a flow diagram illustrating one particular methodology for carrying out the present invention. In step 200, the processor 60 performs general initializations to the developer heating system 20. In step 210, the processor 60 maps at least a portion of the developer 22 into a plurality of grid blocks "XY". In step 220, temperature determinations are made with respect to the various developer portions mapped by the respective grid blocks XY. In step 230, the processor 60 determines if all grid block measurements have been taken. If no, the processor 60 returns to step 220. If yes, the processor 60 analyzes the determined temperature values against a table of acceptable temperature levels for the respective portions of the developer 22. In step 250, the processor 60 determines if any grid block temperature values are not acceptable. If all values grid block temperature values are acceptable, the processor 60 ends this particular iteration of the present methodology and returns to step 220 to perform another iteration. If unacceptable temperature values are found for any of the grid blocks, the processor 60 advances to step 270 where the unacceptable temperature values are analyzed. After the analyses, the processor 60 controls relevant lamps 40 (which correspond to the grid blocks with unacceptable temperature values) to regulate the temperature of the respective developer portions to an acceptable level. The present iteration is then ended and the process returns to step 220 to perform another iteration.

It is to be appreciated that the develop time may also be regulated by the system 20 as described in FIGS. 1–8 herein above. That is, generated profiles of the substrate 26 may be compared at timed intervals to determine image size uniformity across the substrate 26. In addition, the grid block mapping may facilitate pinpointing portions of the substrate 26 which require more development time in the current cycle (or less time in a subsequent cycle) in order to compensate for the center to edge variations. More specifically, a plurality of timers to time the exposure time of the developer, whereby each timer corresponds to a respective grid block may be used. A UV/Vis spectrophotometry system may be employed to determine exposure times corresponding to the respective grid blocks of the developer. Finally a processor can be used to coordinate control of the heaters and timers, respectively, in accordance with determined temperatures and exposure times of the respective grid blocks of the developer.

The present invention provides for a system and method for regulating in-situ developer temperature and time. As a result, the present invention facilitates improving developer integrity and reliability which in turn afford for increases in quality of image transfer in lithographic processes employing a developer with exposure time and temperature regulated in accordance with the present invention. Because the present invention can be performed in-situ as well as in conjunction with a closed loop with feed back control capabilities, develop time and temperature may be optimized across the substrate to retain image transfer fidelity. Circuit performance is thereby achieved and product yield loss is mitigated without requiring a number of additional fabrication process steps.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A system for regulating in-situ developer temperature, comprising:
    at least one lamp operative to heat a portion of a developer;
    a lamp driving system for driving the at least one lamp;
    a system for directing radiation to the portion of the developer;
    a measuring system comprising a UV/Vis spectrophotometry system for measuring parameters of the developer based on radiation reflected from the developer; and
    a processor operatively coupled to the measuring system and the lamp driving system, the processor receiving developer parameter data from the measuring system and the processor using the data to at least partially control the lamp so as to regulate the temperature associated with the portion of the developer.

2. The system of claim 1, the processor being operatively coupled to the UV/Vis spectrophotometry system, the processor analyzing data relating to developer temperature received from the UV/Vis spectrophotometry system, and the processor basing control of the at least one lamp at least partially on the analyzed data.

3. The system of claim 2, the data further relating to thickness of the developer.

4. The system of claim 2, the data further relating to color of the developer.

5. The system of claim 2, the data further relating to absorptivity of the developer.

6. The system of claim 1, the processor mapping the developer into a plurality of grid blocks, and making a determination of developer temperature at a grid block.

7. The system of claim 6, wherein the processor determines an existence of an unacceptable temperature for at least a portion of the developer based upon the determined temperature differing from an acceptable value.

8. The system of claim 7, wherein the processor controls the at least one lamp to regulate the temperature of the developer portion to an acceptable value.

9. The system of claim 1, the developer including a substantially inert material which causes a color of the developer to vary with changes in developer temperature.

10. The system of claim 9, the substantially inert material including europium chelate.

11. A method for regulating in-situ developer temperature and exposure time, comprising:

defining a substrate as a plurality of portions;

defining a developer deposited over the substrate as a plurality of portions;

directing radiation having a wavelength from 190 nm to about 800 nm onto at least one of the portions of the substrate and of the developer;

collecting radiation intensity reflected from at least one of the portions of the substrate and of the developer;

during development, analyzing the reflected radiation intensity to determine the temperature of the at least one portion of the developer and to determine an image size of the substrate portion;

controlling a heating device to regulate the temperature of the developer portion; and controlling a timing mechanism to regulate the exposure time of the substrate portion.

12. The method of claim 11, further comprising using an UV/Vis spectrophotometry system to process the reflected radiation.

13. The method of claim 12, further comprising using a processor to control the at least one heating device based at least partially on data received from the UV/Vis spectrophotometry system.

14. A method for regulating in-situ temperature and exposure time of a developer, the developer overlying a substrate comprising an image pattern, comprising:

partitioning the developer into a plurality of grid blocks;

using a plurality of heaters to heat the developer, each heater functionally corresponding to a respective grid block;

using a plurality of timers to time the exposure time of the developer, each time sensor corresponding to a respective grid block;

determining temperatures corresponding to the respective grid blocks of the developer using a UV/Vis spectrophotometry system;

determining exposure times corresponding to the respective grid blocks of the developer using a UV/Vis spectrophotometry system; and using a processor to coordinate control of the heaters and timers, respectively, in accordance with determined temperatures and exposure times of the respective grid blocks of the developer.

15. The method of claim 14, wherein determining exposure time of portions of the developer comprises:

generating a profile of the substrate; and comparing the generated profile with a database, the database comprising profiles corresponding to substrates having known exposure times to find a closest match to the generated profile.

16. The method of claim 15, wherein generating a profile of the substrate comprises:

irradiating the substrate with radiation having a wavelength from 190 nm to about 800 nm;

collecting the radiation reflected from the substrate; and determining a spectrum of reflected intensity of the radiation against the substrate using UV/Vis spectrophotometer techniques.

17. A system for regulating in-situ temperature of a developer, comprising:

means for defining a substrate as a plurality of portions;

means for defining a developer deposited over the substrate as a plurality of portions;

means for directing radiation having a wavelength from 190 nm to about 800 nm onto at least one of the portions of the substrate and of the developer;

means for collecting radiation intensity reflected from the at least one portion corresponding to the substrate and to the developer;

during development, means for analyzing the reflected radiation intensity to determine the temperature of the at least one portion of the developer and to determine an image size of the at least one portion of the substrate;

means for controlling a heating device to regulate the temperature of the developer portion; and means for controlling a timing mechanism to regulate the exposure time of the substrate portion.

* * * * *